United States Patent
Cook et al.

(10) Patent No.: US 7,479,029 B2
(45) Date of Patent: Jan. 20, 2009

(54) MODULAR WATTHOUR METER SOCKET AND TEST SWITCH

(75) Inventors: Norman D. Cook, New Philadelphia, OH (US); Christopher D. Napier, Akron, OH (US); Robert B. Embly, Massillon, OH (US); Darrell Robinson, Highland, MI (US)

(73) Assignee: Meter Devices Company, Inc., Canton, OH (US)

( * ) Notice: Subject to any disclaimer, the term of this patent is extended or adjusted under 35 U.S.C. 154(b) by 0 days.

(21) Appl. No.: 10/831,992

(22) Filed: Apr. 26, 2004

(65) Prior Publication Data

US 2005/0239325 A1   Oct. 27, 2005

(51) Int. Cl.
   *H01R 33/945*   (2006.01)
(52) U.S. Cl. ....................... 439/517; 361/664
(58) Field of Classification Search ............ 439/517, 439/569, 574–576, 571–573; 361/659–672; 248/220.21, 222.11, 222.12, 316.7, 225.21; 211/87.01, 26, 88.01, 90.01
   See application file for complete search history.

(56) References Cited

U.S. PATENT DOCUMENTS 2,980,882 A * 4/1961 Davis, III .................. 439/517
3,761,780 A * 9/1973 Plummer ..................... 361/667
4,404,521 A * 9/1983 Fennell ....................... 361/664
4,796,844 A * 1/1989 Barker .................... 248/225.21
6,384,350 B1   5/2002 Shincovich et al. ............. 200/5
6,475,028 B1  11/2002 Robinson et al. ............. 439/135
6,488,535 B1  12/2002 Robinson et al.

OTHER PUBLICATIONS

Meter Devices Company, Inc., Lexan Non-Corrosive Prewired Meter Socket, Publication 2002.
Meter Devices Company, Inc., Transformer Rated Meter Socket-Series 300.
Marwell Corporation, Polyphase A-Based Adapter With States Test Switch, Model No. 2200 N-SP1262.
Ekstrom Industries, Inc., Series 2100 Adapter With Test Switch (2002).
Marwell Corporation, Auto By-Pass Conversion Adapter, Sep. 2002—Model No. PTS-13-MTS.
Meter Devices Company, Inc., Transockets Series 3100 & 3600, Bulletin MD 3100-3600/3M, 2002.

* cited by examiner

*Primary Examiner*—Felix O Figueroa
(74) *Attorney, Agent, or Firm*—YoungBasile, PC (57) ABSTRACT

A modular meter socket is releasably mountable in a housing. Support clips are disposed in the housing by fixing a mounting plate carrying the clips in the enclosure. A mounting panel fixedly carries the meter socket and is attached to the clips without the use of tools operative fasteners or additional fasteners. Alternately, a meter socket and a bypass device are unitarily mounted on a mounting panel for attachment to the clips in the housing. The meter socket and the bypass device may be mounted on separate panels, each attached to the clips in the housing without additional fasteners.

23 Claims, 10 Drawing Sheets

MODULAR WATTHOUR METER SOCKET AND TEST SWITCH

BACKGROUND

The present invention relates, in general, to electrical watthour meters and, specifically, to electrical watthour meter sockets, and more specifically, to meter sockets and bypass devices for use with current transformers.

In the electric utility industry, watthour meters are employed to measure electrical power consumption at a residential or commercial building establishment. A cabinet is typically mounted on an outside wall of the residence or building and contains a meter socket having pairs of line and load contacts which are connected to electric power line conductors extending from the utility power network and electric load conductors connected to the residential or building establishment power distribution network. The contacts receive blade terminals on a plug-in watthour meter to complete an electric circuit through the meter between the line and load terminals mounted in the cabinet for the measurement of electrical power consumption.

The meter socket is typically mounted on the rear wall of the cabinet by fasteners, such as or bolts, which extend through the meter socket into the rear wall. Alternately, the meter socket can be mounted on a separate back panel over threaded studs mounted on the rear wall of the cabinet and extending inward through apertures in the panel to receive nuts.

Current transformer or CT rated watthour meters and socket adapters are employed in high current applications. Current transformers coupled to the line and load conductors have their output leads connected to terminals in a current transformer or CT rated watthour meter socket adapter. A low current rated watthour meter is then plugged into the socket adapter to measure power consumed at the building site.

In addition, potential coils in a watthour meter may also be connected via potential blade terminals into potential jaw contacts mounted in the socket adapter and connected by individual conductors to terminals mounted in the terminal portion of the socket adapter.

However, with current transformer rated socket adapters or sockets, it is necessary to short circuit the line and load terminals when the watthour meter is removed from the socket for replacement or testing. Heretofore, bypass devices, which as test switches and slidable link test blocks have been used with CT rated sockets to provide the necessary short circuit or bypass feature.

Exemplary test switches and link test blocks are made by Meter Devices Company, Inc. of Canton, Ohio, the assignee of the present invention. Such bypass devices are typically mounted in a watthour meter socket cabinet immediately below a watthour meter socket. The test switches are generally in the form of single throw, knife-type switches which are provided in multiples ganged together into one assembly; but each electrically connected between one line contact or one load contact in the socket and one current transformer lead. Once an optional socket cover is removed, the test switches can be operated as desired to provide the necessary bypass connection between the line and load contacts and conductors from the current transformers prior to removing the watthour meter from the socket for testing, recalibration, replacement, etc.

Another bypass device is a link test block which is similar to test switches except that a link is removable or slidable between positions to selectively provide the bypass function.

Figure 1:
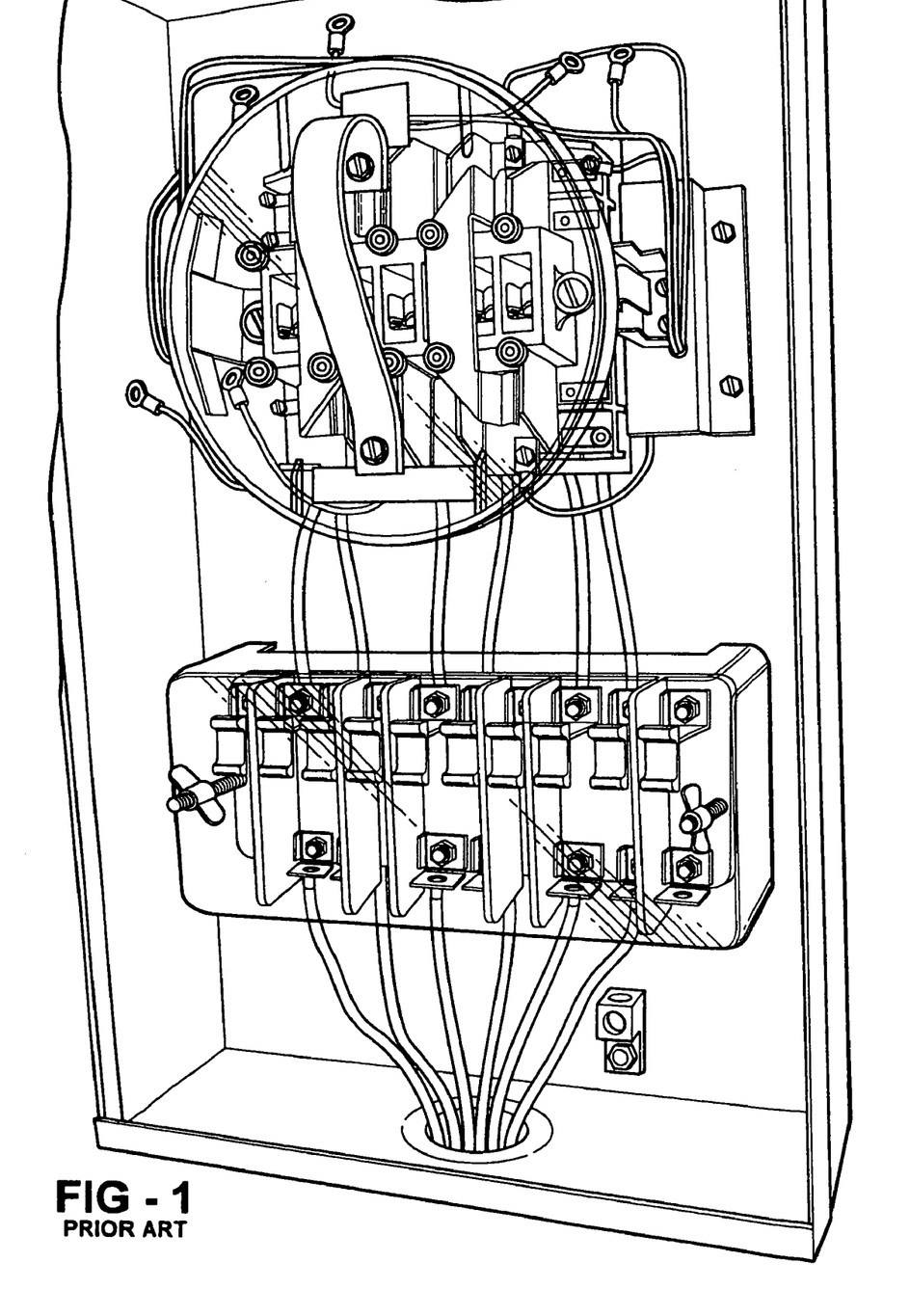
FIG. 1 is a perspective view of a prior art meter socket and bypass assembly.

In use, the meter socket itself or along with a bypass device, as shown in FIG. 1, are separately mounted in a socket enclosure or housing. The individual socket terminals are wired to the bypass device terminals.

Figure 2:
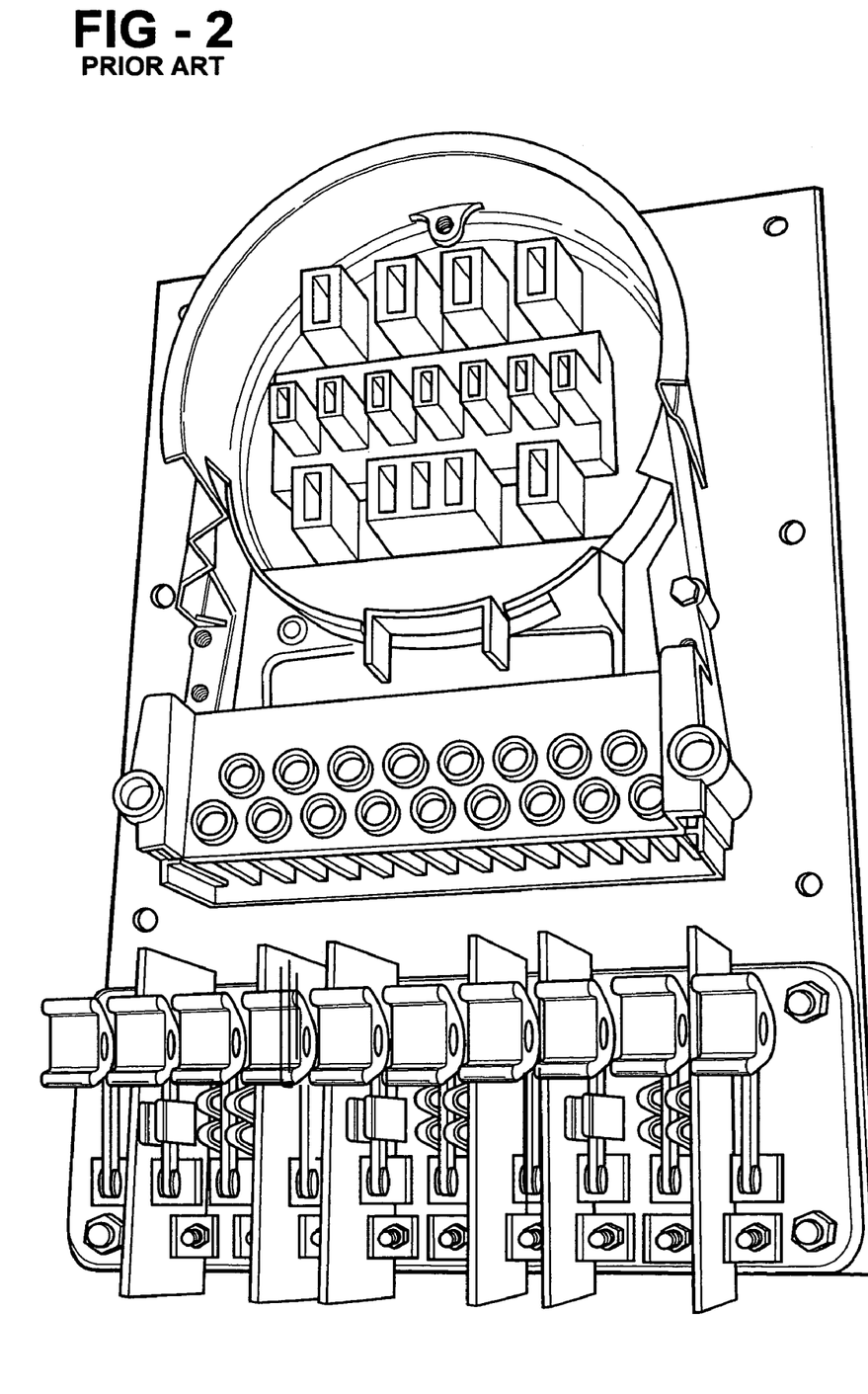
FIG. 2 is a perspective view of another prior art meter socket and bypass assembly.

As shown in FIG. 2, it is also known to mount a meter socket, such as an Ekstrom Industries, Inc., 2100 Series, bottom feed to socket-type adapter on a mounting panel along with a test switch assembly which is separably mounted on the same panel. The meter socket and test switch assembly is then mounted by fasteners on a meter enclosure back panel or in a meter socket housing which extend through apertures in the back panel and receive nuts.

Ekstrom Industries, Inc., has sold a 2100 adapter with built-in or integrally mounted test switches which are mounted below the socket adapter jaw contacts in place of the normal power terminals as shown in U.S. Pat. Nos. 6,475,028 and 6,488,535.

Marwell Corporation has sold a similar 2200 series polyphase A-base to socket adapter with integral mounted test switches as Model Nos. 220-SP-1262. Marwell Corporation has also sold a bi-pass converter adapter, Model No. PTS-13-MTS, which includes a socket mounted in a circular housing which is connected by a sleeve to a meter test switch housing in which the meter test switch is mounted. Conductors pass through the sleeve between the meter jaw contacts and the meter test switch terminals.

While the above-described meter socket and test switches or links provide an effective bypass for use with current transformers in high current load applications, developments in the electrical utility industry pertaining to component ownership and component installation practices have created problems with respect to insuring efficient installation of the proper meter socket and/or meter socket and bypass device at the proper location in a building or use site.

The meter sockets are available in at least three different configurations of jaw contacts for single or three-phase applications, and the presence or absence of potential jaw contacts.

In one ownership/installation scenario, the electric utility owns all of the metering and bypass components and associated socket housings and is responsible for installing the entire assembly at each use site. This requires the utility to maintain a large inventory of the different meter sockets and different bypass devices which results in increased costs to the utility. However, in this situation, the utility company is more likely to install the proper meter socket and bypass device at the proper use location.

In a second ownership/installation situation, the customer owns all of the meter socket and bypass components. A contractor buys the meter socket enclosure, the meter socket and the bypass device from an electrical distributor. These components may be separate or pre-assembled and wired in the socket enclosure or separately mounted in the enclosure and wired by the contractor before the contractor mounts the enclosure at the use site. Frequently, however, due to lack of experience and other factors, the contractor will mount the meter socket and bypass device configuration in the wrong location in a use site or the incorrect socket and bypass device at a given location. This requires replacement of the meter socket and/or the bypass device by the utility or by the contractor at a later date.

In a third ownership/installation situation, the contractor purchases the socket enclosure from an electrical distributor and installs it at a particular location in the use site. The utility then mounts and wires the meter socket and the bypass device in the enclosure at the use site. The mounting of the meter socket and the bypass device in the enclosure by the utility can be done by mounting a pre-wired meter block and bypass device attached to a back panel on the rear wall of a mounted enclosure on four threaded studs or screws extending through the back wall and the panel into the interior of the enclosure. This requires the proper tool operated fasteners, such as nuts, and takes additional assembly time.

The added time and cost of replacing an improperly configured meter socket and bypass device in the field or the time involved in mounting the panel in the enclosure increases the overall costs of the assembly.

Thus, it would be desirable to provide a meter socket and/or a combined meter socket and bypass device apparatus which overcomes the above-described deficiencies occurring with the use of prior art meter socket assemblies. It would also be desirable to provide a meter socket and/or meter socket and bypass device which can quickly be mounted or removed from an enclosure at a use site.

SUMMARY

The present invention is a modular meter socket or a meter socket bypass apparatus which is releasably mountable in an enclosure. The meter socket and the meter bypass apparatus may be prewired on a mounting panel prior to releasable mounting of the panel in the enclosure.

In one aspect, an electrical power service apparatus comprises a housing having a rear wall, a meter socket having jaws for electrical connection to a watthour meter, support means for supporting the meter socket and means, cooperating between the housing and the support means, for slidably attaching the support means carrying the meter socket in the housing without additional fasteners or tool operated fasteners.

The support means may be a panel with the meter socket alone or the meter socket and the bypass means fixedly mounted on the panel. Alternately, the support means may be separate panels, one fixedly carrying the meter socket and one fixedly carrying the bypass means, each panel incorporating attaching means for separate mounting in the housing without additional fasteners.

The attaching means can be a mounting plate mounted to the rear wall of the housing, and means, carried on the mounting plate, for releasably receiving the support means.

The releasable receiving means may be clips fixedly carried on the mounting plate and having a portion spaced from the mounting plate to define a gap for receiving the mounting panel therein. The clips may be integrally formed from the mounting plate. Apertures are formed in the mounting panel in positions complementary to the positions of the clips on the mounting plate for releasable positioning over the clips.

In another aspect, means are provided for mounting the plate to the housing rear wall. The means for mounting the plate may be fasteners fixed to the rear wall of the housing and having a threaded end extending into an interior of the housing.

In another aspect, means are provided for disengaging the mounting panel from the clips. The disengaging means may be a tool receiving aperture formed in the mounting plate and positioned along one edge of the mounting panel.

The unique modular meter socket and/or meter socket and bypass apparatus of the present invention provides releasable mounting of a meter socket or a meter socket and meter bypass assembly in an enclosure. The mounting panel carrying the meter socket or bypass means is releasably received on the mounting plate in the enclosure without the use of additional fasteners or tools.

In another aspect, a unique method is disclosed for removably mounting a meter socket or a meter socket and a bypass device in an enclosure. The enclosure is provided with panel support means for removably receiving a panel carrying a pre-mounted meter socket or a unitary socket and bypass device in the enclosure without the use of tools or additional fasteners.

The method also includes the steps of mounting clips in the enclosure in a position to slidably mounting the panel to releasably support the mounting panel in the enclosure.

In another aspect, the method includes the step of providing the clips on a mounting plate fixedly mounted in the enclosure. The clips engage apertures in the panel to slidably receive and support the panel in the enclosure.

BRIEF DESCRIPTION OF THE DRAWING

The various features, advantages and other uses of the present invention will become more apparent by referring to the following detailed description and drawing in which.

DETAILED DESCRIPTION

Referring now to the drawing, and to FIGS. 3-6 in particular, there is depicted one aspect of a modular meter socket and bypass apparatus 10 constructed in accordance with one aspect of the present invention.

Figure 3:
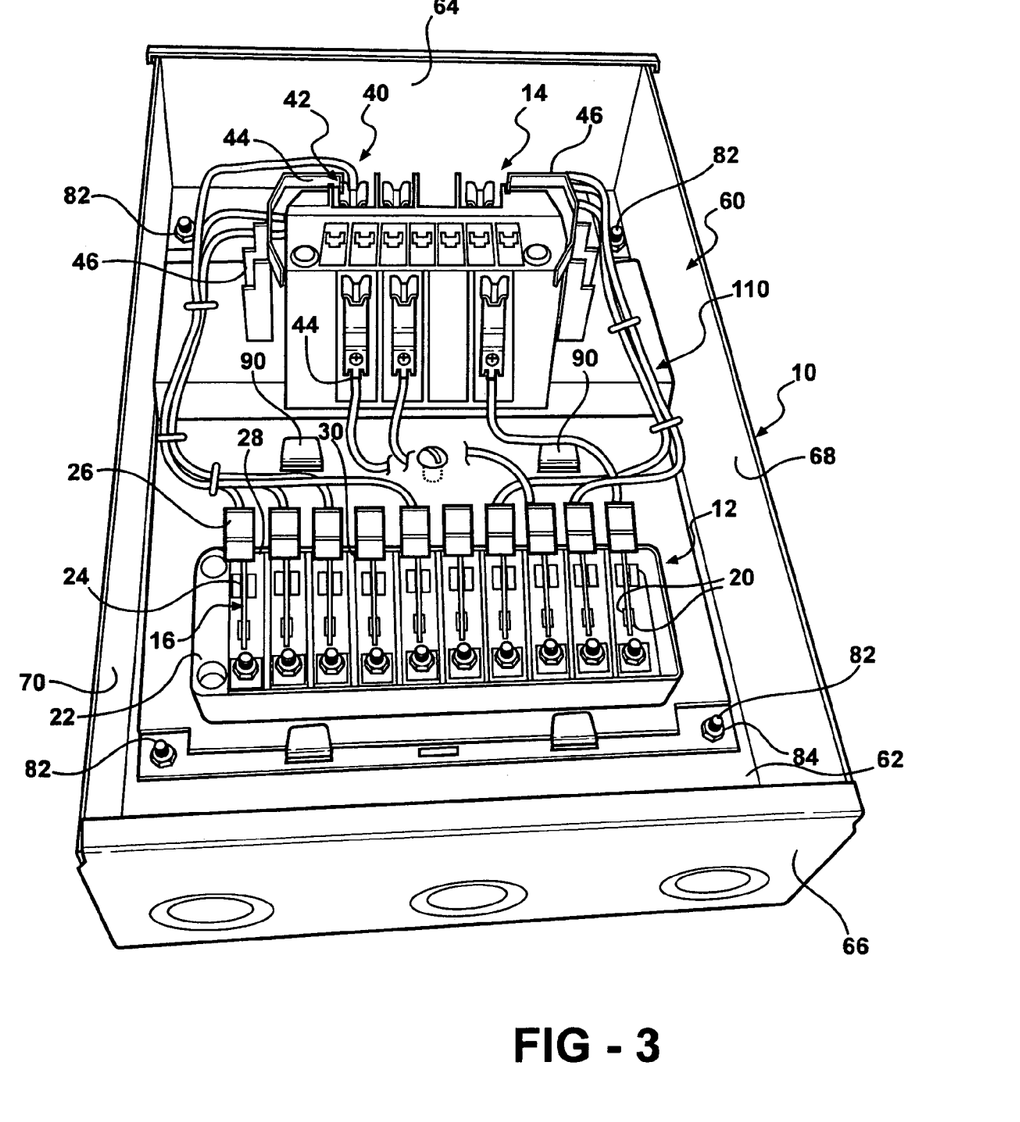
FIG. 3 is a perspective view of a modular meter socket and bypass assembly according to one aspect of the present invention.

The apparatus 10 includes a bypass means 12 formed of a plurality of individually operable switches 12, each of which is a separately actuatable switch 16 or contact capable of opening and closing an electrical circuit between two conductors attached to two terminals connected to each switch.

In the following example, the bypass apparatus 12 is described in conjunction with an electrical watthour meter socket 14 and, more particularly, a current transformer rated socket wherein individual connections to certain of the switch modules are made to current transformers coupled to line and load conductors extending from the socket 14, it will be understood that the bypass apparatus 12 may be employed in numerous other applications.

Further, in the specific watthour meter socket application described and illustrated hereafter, the bypass apparatus 12 is depicted in a three-phase configuration including six switches 16 arranged in three pairs for the three phase current connections, three switch modules for the three-phase potential connections and one switch module for the neutral or ground connection. Other test switch configurations, including test switches arranged for only a single phase socket application, may also be constructed in accordance with the present invention.

As shown in FIG. 3, each switch carries one test switch or test contact 16. Each test switch 16 includes a hinge jaw formed of a pair of spaced legs 20 mounted on a base 22. A switch or knife blade 24 is pivotally connected at one end to the legs 20 and is moveable between first and second positions about a pivot point formed by the rivet or other connection of the knife blade 24 to the legs 20. An insulated plastic handle 26 is mounted on one end of the knife blade 24. An aperture may be formed in all of the handles 26 for receiving a gang bar for actuation of all of the test switches 16 in one pivotal movement. An intermediate portion of each knife blade 24 engages a jaw contact 28 also mounted on the base 22.

Terminals 30 and 32 are formed as part of each test switch 16 and are also mounted on the base 22. The terminals 30 and 32 respectively receive conductors from the meter socket 14 and leads from external current transformers, not shown.

An optional cover, such as a transparent plastic cover, not shown, may be attached to the base 22 by standoffs and positioned to overlay the test switches 16 to protect the test switches 16 from inadvertent contact by a user. The cover is removed when it is necessary to switch the position of the handles 26 of the test switches 16.

Further details concerning the construction and operation of the bypass or test switch assembly 12 may be had by referring to a meter test switch assembly, Catalog No. 110-54583, sold by Meter Devices Company, Canton, Ohio.

Alternately, the bypass apparatus 12 may be a removable or slidable link test block, also sold by Meter Devices Company, Canton, Ohio, Catalog No. 2035 and shown in Bulletin No. 493.

The meter socket 14 is adapted for plug-in connection to blade terminals on a watthour meter, not shown. The meter socket 14 includes an insulated housing 40 having individual slots for receiving a plurality of jaw contacts, all denoted by reference number 42. Each jaw contact 42 is fixedly mounted on the housing 40 and is connected to a terminal end 44 for connection to a conductor extending between the meter socket 14 and the test switch assembly 12.

Any number of jaw contacts 42 may be provided depending upon whether or not the meter socket 14 is devised for single or three phase electrical power service. Potential contacts 44 may also be mounted in the housing 40 and connected by conductors to selected test switches 16.

By way of example only, side mounting guards 46 may be provided adjacent opposite side ends of the housing 40 to act as a centering guide for a watthour meter during insertion of the watthour meter socket 14.

Referring again to FIGS. 3-6, the apparatus 10 includes an enclosure or housing 60. The housing 60 is formed of a suitable material, such as a coated metal. By way of example only, the housing 60 is formed of a back wall 62, top and bottom walls 64 and 66, respectively, and opposed side walls 68 and 70. The side walls 68 and 70 and the top and bottom walls 64 and 66 have joined or sealed ends which form a closed sided enclosure having an open end opposed from the rear wall 62. The open end is closed by a removable or pivotal cover, not shown, which has an aperture for receiving a portion of a watthour meter mounted in the socket 14 therethrough.

Figure 4:
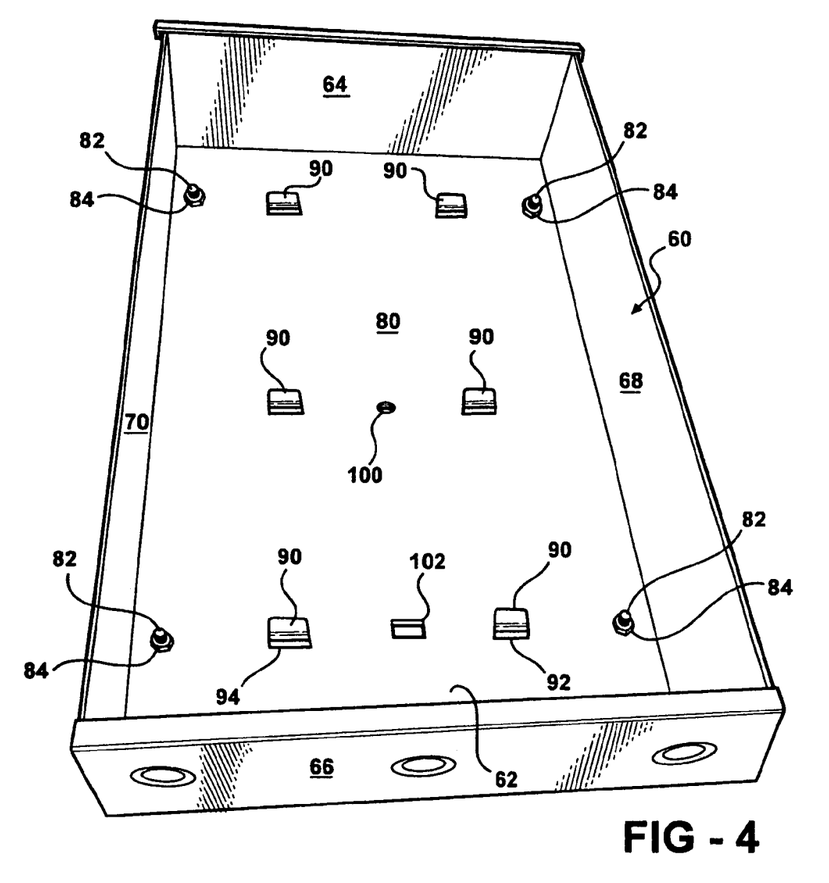
FIG. 4 is a perspective view of the socket housing used with the meter socket and bypass assembly shown in FIG. 3.

According to the present invention, a mounting plate 80 is fixedly mounted on the rear wall 62. The mounting plate 80 is formed of a suitable corrosion resistant material, such as galvanized steel, by way of example only.

The mounting plate 80 is fixed to the rear wall 62 of the housing 60 by means of fasteners 82. Preferably, the fasteners 82 are threaded studs. The heads of such studs 82 are swedged or otherwise fixedly mounted in the rear wall 62, with the threaded stud portion extending through an aperture in the rear wall 62 into the interior of the housing 60. A nut 84 is mountable over the stud 82 to fix the mounting plate 80 on the rear wall 62 of the enclosure 60.

Figure 5:
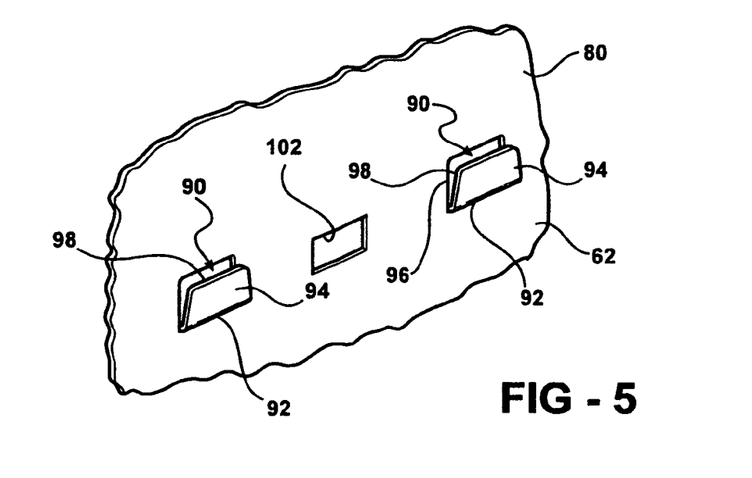
FIG. 5 is an enlarged, partial, perspective view showing the bottom portion of the socket housing shown in FIG. 4.

As shown more clearly in FIGS. 4 and 5, the mounting plate 80 forms a means for attaching a meter and bypass assembly in the enclosure 60 without additional tool operated fasteners. The attaching means, in this aspect of the invention includes, at least one and preferably a plurality of spaced clips 90, with six clips 90 being shown by way of example only. The clips 90 are shown in greater detail in FIG. 5 as being unitarily formed by stamping from the mounting plate 80. This will be understood to be by example only as the clips 90 could also be mounted as separate fixed elements to the mounting plate 80, such as by welds, etc. Also by way of example, the clips 90 are arranged in three spaced pairs along the length of the mounting plate 80 as shown in FIG. 4.

In the illustrated example, the clips 90 are stamped out of the plane of the mounting plate 80 and form a side arm 92 and an outer leg 94 which extend out of an aperture 96 in the mounting plate 80. A gap 98 is formed opposite from the arm 92 between an inner surface of the outer leg 94 and the mounting plate 80. The gap 98 receives a socket and bypass assembly support means or mounting panel as described hereafter.

It will also be understood that the clips 90 may be mounted on the back or rear wall 62 of the enclosure or housing 60. The clips 90 may be fixedly attached as separate components to the back wall 62 by means of fasteners, welds, etc. The clips 90 may also be stamped out of the back wall 62, in the same manner as described above for the clips 90 on the mounting plate 80, as long as any openings formed in the back wall 62 after the clips 90 are stamped and bent out of the plane of the back wall 62, are sealed or otherwise closed.

The clips 90 may include a bent arm, not shown, or projection which is bent out of the plane of the outer end of the clip 90 toward the plate 80. The arms bend back toward the end of the clip 90 when the panel is slid into the clips 90. The arms then releasibly snap into apertures in the panel to releasibly lock the panel in the plate 80. The ends of the clips 90 can be forced outward to disengage the arms from the panel for separation of the panel from the plate 80 and the housing.

Also formed on the mounting plate 80, as shown in FIG. 4, is an aperture 100 located approximately centrally in the mounting plate 80. The aperture 100 is positioned to receive a lock fastener as described hereafter.

A disengaging means in the form of an aperture 102 is also formed along an edge or the bottom end portion of the mounting plate 80. The function of the aperture 102 will be described in greater detail hereafter.

Figure 6:
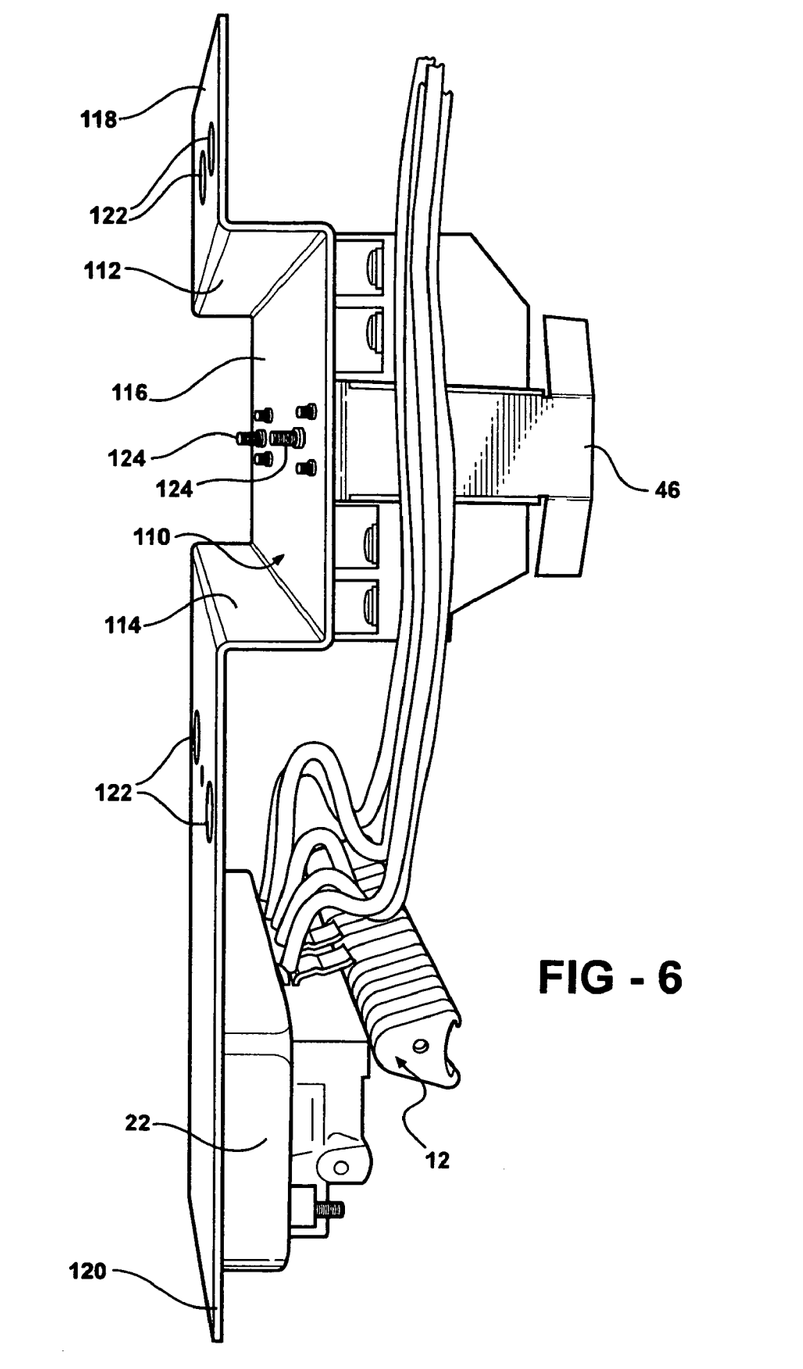
FIG. 6 is a side perspective view showing the slide-in module according to one aspect of the present invention.

As shown in FIGS. 3 and 6, a support means, such as a mounting panel 110, is configured for fixedly receiving the meter socket 14 and the bypass device 12. The mounting panel 110 is formed of a suitable material, such as galvanized steel or a coated metal. The mounting panel 110 has an offset portion formed by side legs 112 and 114 and a central leg 116 which form a raised portion in the panel 110 extending out of the main plane of the generally planar panel 110. The raised portion is formed between one end portion 118 and an opposite, larger end portion 120 of the panel 110.

Similarly, apertures may be formed in the end portion 120 of the panel 110 for receiving fasteners to secure the base 22 of the test switch assembly 12 on the panel 110.

Apertures 122 are formed in the mounting panel 110 at positions complementary to the locations of the clips 90 on the mounting plate 80. The apertures 122 enable the panel 110 to be placed over the clips 90 and slid in one direction, such as downward, until the edges of the apertures 122 in the panel 110 engage the inner surface of the arms 94 on each clip 92 to fix the panel 110 on the mounting plate 80. At the same time, the entire mounting plate 110 and the attached meter socket 14 and the test switch assembly 12, may be urged upward to bring the apertures 122 in the panel 110 in alignment with the clips 90 to enable the mounting panel 110 to be separated from the mounting plate 80 and removed from the enclosure 60.

As shown in FIGS. 3 and 6, the centering guides 46 have a bottom flange which overlays the central end 116 of the panel 110. Apertures in the central leg 116 and the flange on the guides 46 receive fasteners for securing the guides 46 to the panel 110. One or more apertures may also be formed in the central leg 116 of the panel 110 for receiving mounting fasteners to fix the housing 40 at the meter socket 14 on the central leg 116 of the panel 110.

As shown in FIG. 3, an optional lock fastener 130 is provided for engagement with an aperture in the panel 110 and the aperture 100 in the mounting plate 80 to fixedly lock the mounting panel 110 to the mounting plate 80.

As also shown in FIG. 3, when the mounting panel 110 is fixed in the clips 90, at least a portion of the aperture 102 in the mounting plate 80 will be exposed or accessible below the lower edge of the mounting panel 110. This provides an opening for receiving a tool, such as a flat headed screwdriver, which can be twisted or rotated in the aperture 102 to forcibly separate the lower edge of the mounting panel 110 from the clips 90. This small amount of separation will facilitate easy removal of the entire mounting panel 110 from the clips 90 in the housing 60.

As shown in FIG. 1, the prior meter socket and bypass assemblies have a ground terminal mounted on the mounting panel which receives a ground conductor from at least the socket adapter and is itself connected to ground to meet ANSI standards.

In the present invention, the fasteners 82 may be employed as a ground connection since the fasteners 82 connect the rear wall 62 of the housing 60 to the mounting plate 80. Since the mounting panel 110 is mechanically coupled to the panel 80 by means of the clips 90 or by the fasteners 82, a ground path exists between all portions of the enclosure 60, the mounting plate 80 and the panel 110. Ground conductors from the socket 14 may be coupled to any of the fasteners 82 to provide the required ground path.

In another aspect of the present invention, a unique method is disclosed for releasably mounting the meter socket or block or a socket and bypass assembly in an enclosure so that the meter socket or block and the socket and bypass device may be releasably mounted in and removed from the enclosure without the use of tools or additional fasteners.

In this aspect, the method includes the steps of:
providing an enclosure having a rear wall;
providing a meter socket; and
providing support means in the enclosure for removably attaching the meter socket in the enclosure without additional fasteners or tool operated fasteners.

The method also includes the steps of providing the support means in the form of clips fixed relative to the rear wall of the enclosure and defining a gap for sliding and receiving the meter socket therein.

The method also includes the steps of pre-mounting the meter socket on a mounting panel. The panel may have engagement surfaces for engaging the panel support means or clips in the enclosure.

The method also includes the steps of forming the panel support means as a mounting plate fixedly mountable in the enclosure and mounting the clips on the mounting plate.

Figure 7:
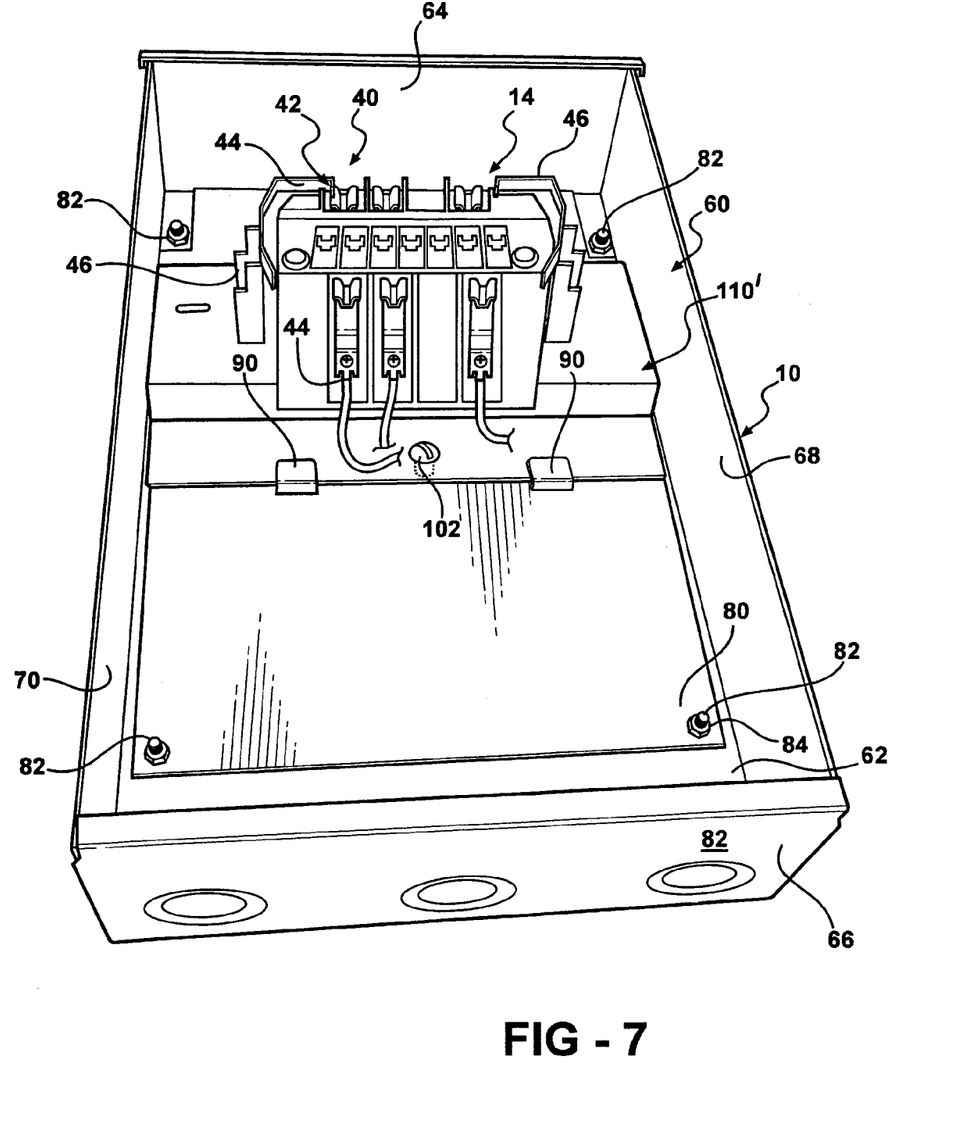
FIG. 7 is a perspective view of another aspect of a modular meter socket according to the present invention.
Figure 8:
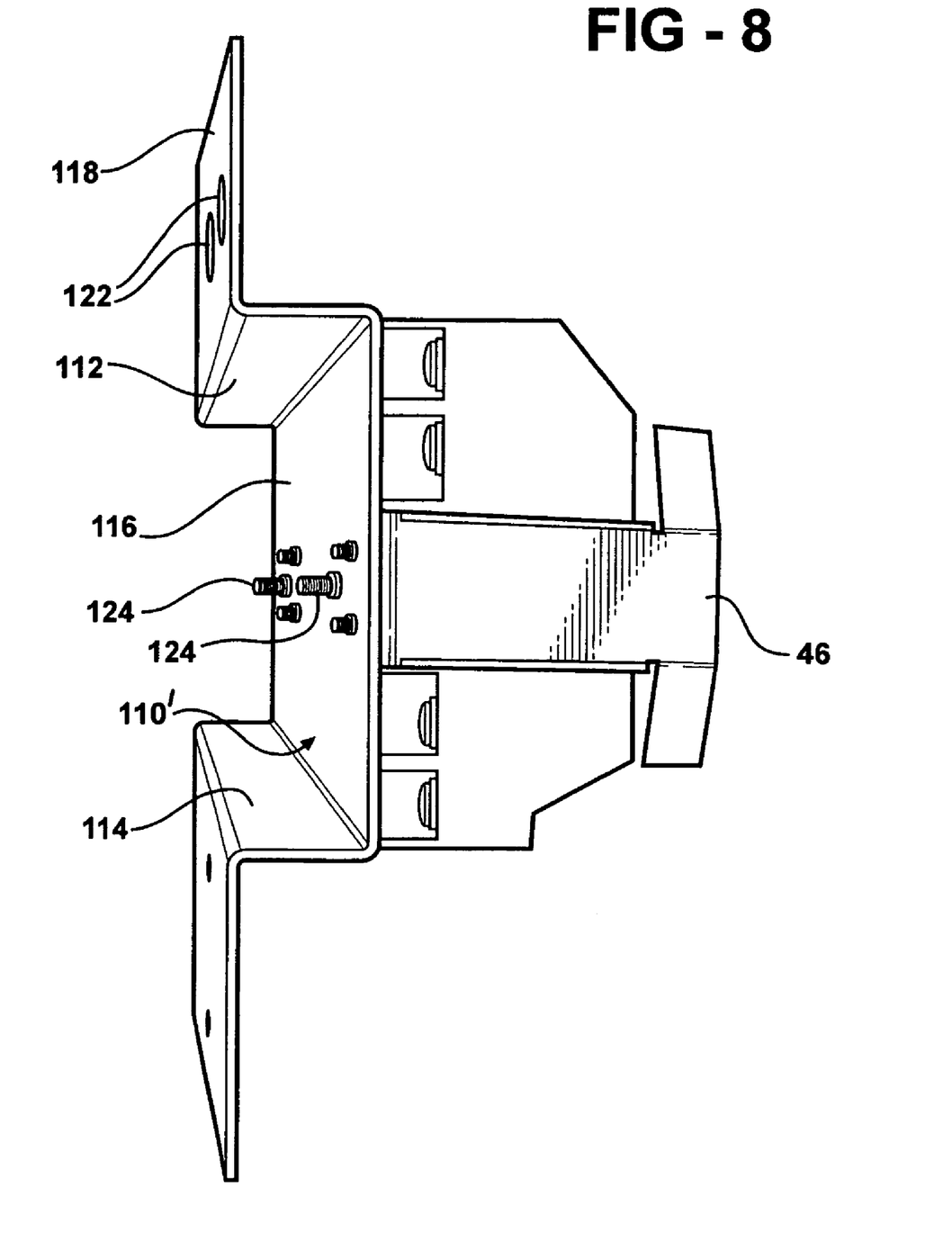
FIG. 8 is a side perspective view of the meter socket shown in FIG. 7.

Referring now to FIGS. 7 and 8, there is depicted another aspect of the present invention in which the meter socket 14 is mounted by itself in the enclosure or cabinet 10.

The mounting means 90 in this aspect of the invention include only four clips 90 formed or otherwise carried on the mounting plate 80. The mounting panel 110' is also modified from that described above in FIG. 6 in that it includes only the upper portion of the panel 110.

As shown in FIG. 7, the mounting panel 110' is mounted in the enclosure 10 by aligning the apertures 122 in the panel 110' with the clips 90 and then urging the panel 110' downward toward the lower end of the enclosure 10 until the surfaces of the panel 110' adjacent to the apertures from which each clip 90 extends engage the inner surface of the arm 92 of each clip 90. Optional lock apertures positioned to receive a lock fastener 102 may also be formed in the panel 110' and in the mounting plate 80.

The modular meter socket apparatus shown in FIG. 7 can be used for any watthour meter socket and/or watthour meter socket adapter to facilitate easy installation and removal of a meter socket or meter socket adapter into an enclosure without additional fasteners or tool operated fasteners.

Figure 9:
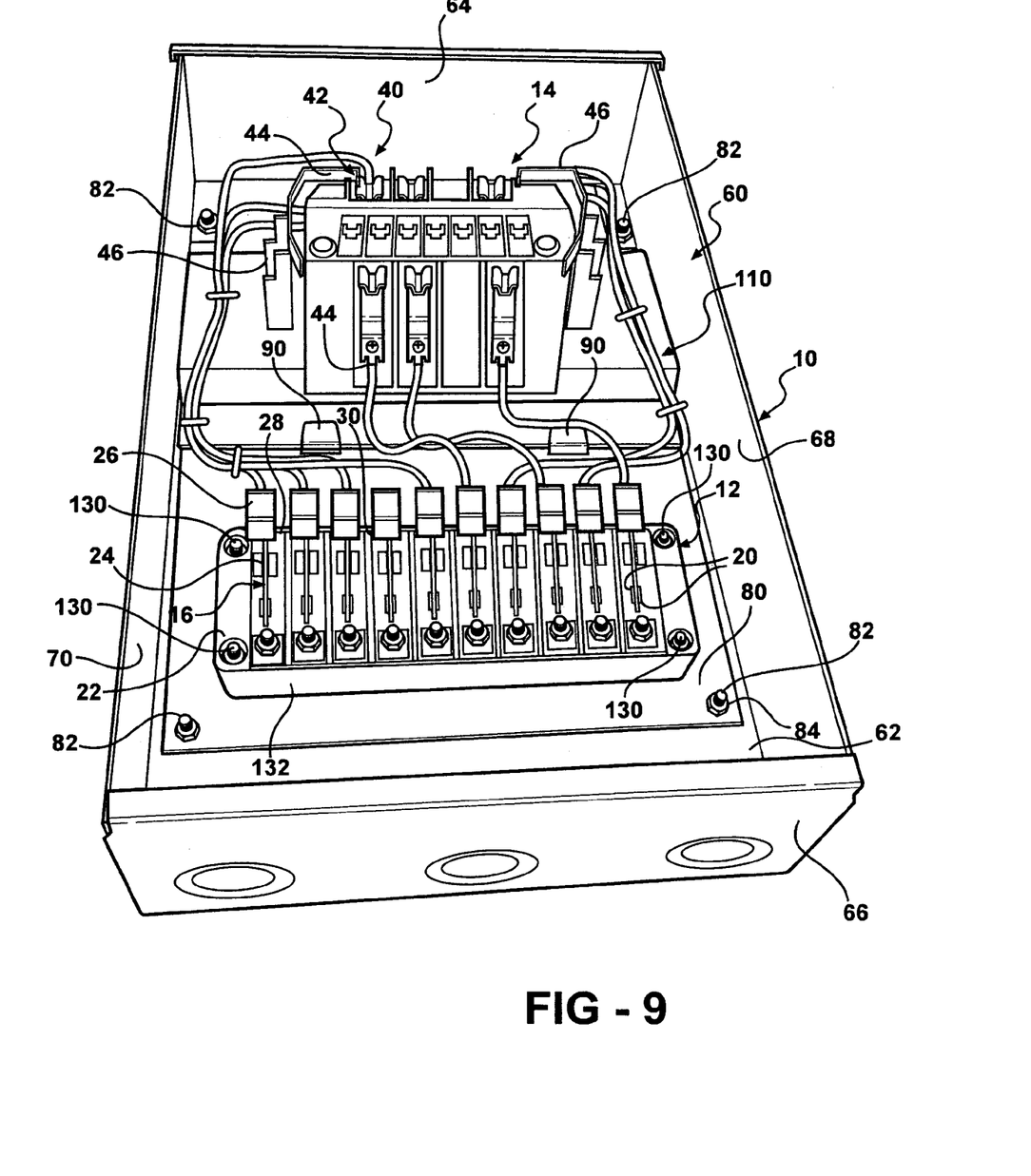
FIG. 9 is a perspective view of another aspect of a meter socket and bypass assembly according to the present invention.

Referring now to FIG. 9, there is depicted another aspect of a modular meter socket according to the present invention in which one bypass device 12, such as the test switches described above and shown in FIG. 3, maybe separately mounted on the mounting plate 80 by means of bolts 130 which extend through bores in the base or mounting block 132 of the bypass device 12.

In this aspect, the bypass device 12 is shown by way of example only, as comprising test switches described above and shown in FIG. 3.

In assembling the device shown in FIG. 9, the meter socket 14 and the bypass device 12 are separately mounted in the enclosure 10. Conductors are then wired between the socket terminals and the bypass or test switch terminals.

Figure 10:
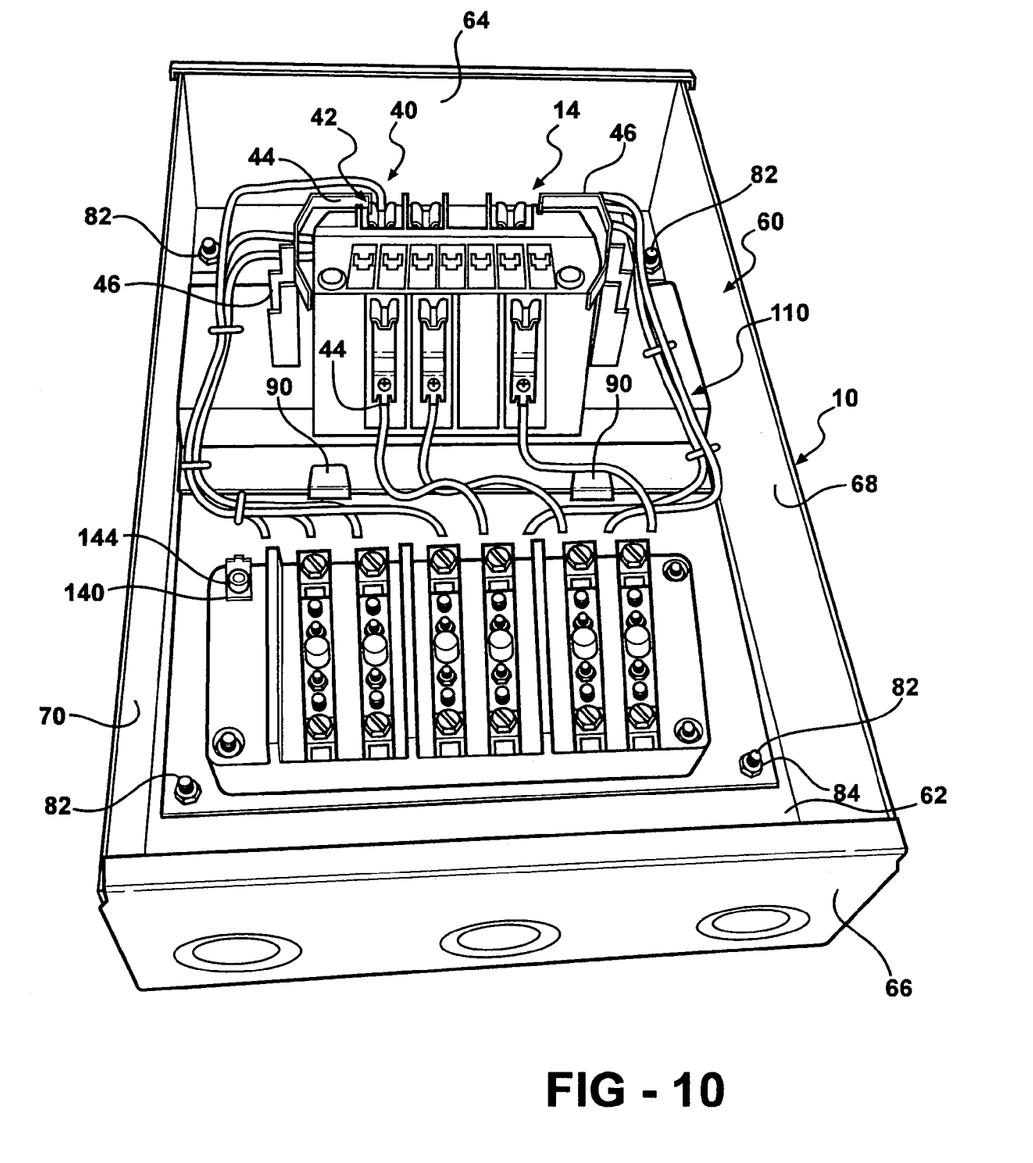
FIG. 10 is a perspective view of yet another aspect of the meter socket and bypass assembly according to the present invention.

FIG. 10 depicts another aspect of the modular meter socket of the present invention which is similar to the aspect shown in FIG. 9, except that the bypass device 12 is depicted as a removable or slidable link test block 140, sold by Meter Devices Company, Canton, Ohio, Catalog No. 2035.

In use, the link test block 140 and the meter socket 14 are separately mounted in the enclosure 10. Conductors are then wired between the socket terminals and the link block terminals.

The link test block 140 is fixed to the mounting panel 80 by means of threaded bolts 144 extending through the mounting plate 80 and bores in the base or mounting block of the link test block 140.

Figure 11:
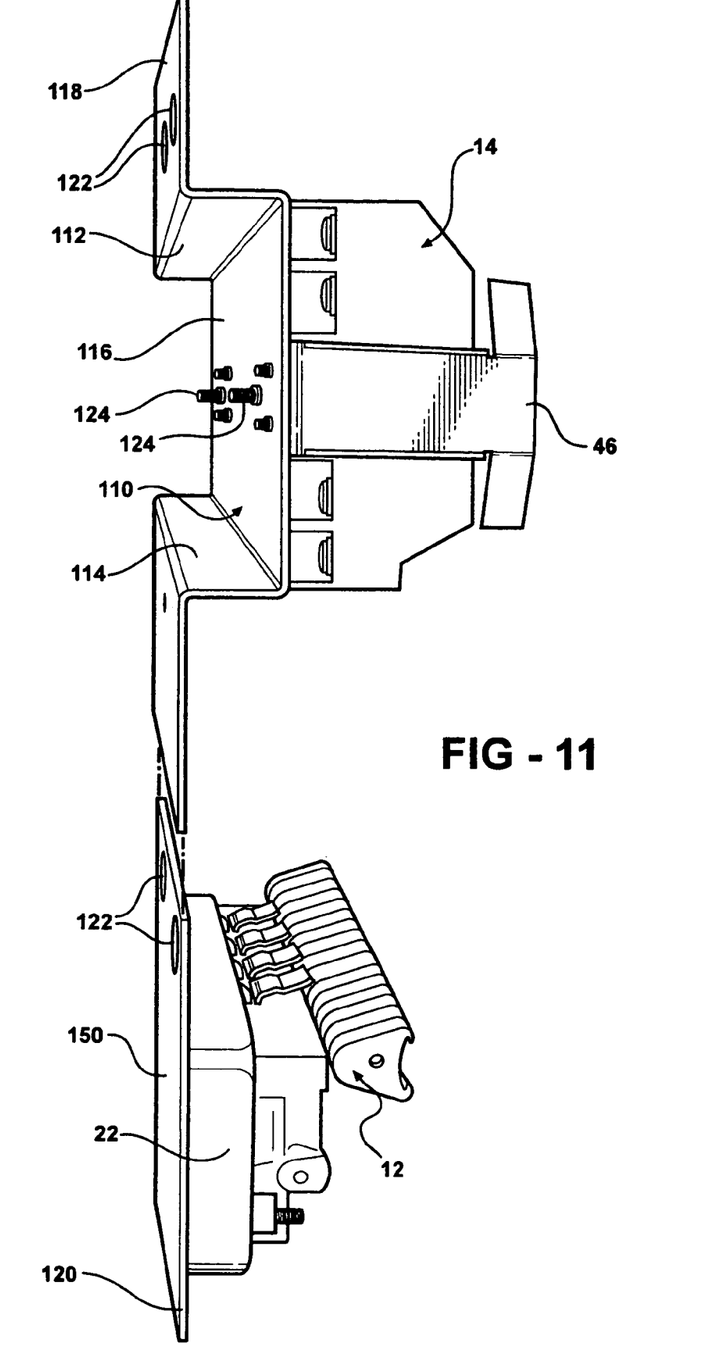
FIG. 11 is an exploded, side perspective view of another aspect of a meter socket and bypass assembly according to the present invention.

Finally, referring to FIG. 11, there is depicted yet another aspect of the present invention in which a modular meter socket is used in combination with a modular bypass device 12 for separate slide-in mounting in the enclosure 10 without the use of additional fasteners or tool operated fasteners.

The meter socket 14 and its associated mounting panel 110' are the same as that described above and shown in FIG. 8.

The bypass device 12, which is depicted by way of example only as being the above-described test switches and which may also be a link test block as shown in FIG. 10, is itself mounted on a panel 150 which has a generally planar configuration. A plurality of apertures 142 are formed in the panel 150 for engagement with a plurality of complimentary located clips 90 formed or carried on the mounting plate 80 in a manner similar to that depicted in FIG. 4. In this manner, the mounting of the meter socket 14 and the bypass device 12 are both implemented by a slide-in attachment without the use of additional fasteners or tool operated fasteners.

In summary, there has been disclosed a unique modular meter socket and mounting method which removably mounts a meter socket or a meter socket and test switch assembly in an enclosure to facilitate installation and/or removal of the meter socket relative to a metering site.

What is claimed is:

1. An electrical power service apparatus comprising:
a housing having a wall;
a meter socket having contacts for electrical connection to blade terminals of a watthour meter;
a panel supporting the meter socket;
a plurality of clips in a preset arrangement carried in the housing, each clip having one portion spaced from the wall of the housing to define an opening for downwardly slidably receiving and supporting the panel in the housing without tool operative fasteners; and
at least one of the clips positioned in the housing to engage a bottom edge of the panel.

2. The electrical power service of claim 1 wherein:
the housing includes a plurality of housings, each housing having a wall;
the panel includes a plurality of substantially identical panels, each of the plurality of panels capable of supporting one of a plurality meter sockets, each having a plurality of jaw contacts arranged in any of a plurality of distinct configurations, each of the plurality of panels including a plurality of apertures in an identical preset arrangement;
the plurality of clips carried in the housing in a preset arrangement complementary to the preset arrangement of the apertures in each panel, each clip having one portion spaced from the wall of the housing to define an opening between the clip and the wall for downwardly slidably receiving and supporting one panel in the housing without tool operative fasteners;
at least one of the clips positioned in the housing to engage a bottom edge of the panel; and
the preset arrangement of the apertures and the clips being substantially identical for all of the plurality of housings and all of the plurality of panels.

3. The electrical power service apparatus of claim 1 comprising:
a mounting plate mounted to the wall of the housing;
the plurality of clips integrally formed from the mounting plate in a preset arrangement.

4. The apparatus of claim 3 further comprising:
fasteners mounting the mounting plate to the wall of the housing.

5. The apparatus of claim 4 wherein a portion of the fasteners are fixed to the wall of the housing and having a threaded end extending into the housing.

6. The apparatus of claim 3 when the clips extend inward into the housing.

7. The electrical power service apparatus of claim 1 comprising the plurality of clips integrally formed from the wall of the housing.

8. The apparatus of claim 7 further comprising:
apertures formed in the panel dimensionally complementary to the positions of the clips for releasable positioning over the clips.

9. The apparatus of claim 7 further comprising:
means for disengaging the plate from the clips.

10. The apparatus of claim 7 further comprising:
meter bypass means for bypassing the meter socket contacts; and
the panel unitarily supporting the meter socket and the meter bypass means.

11. The apparatus of claim 7 further comprising:
the clips inwardly extending from the wall into an interior of the housing.

12. The apparatus of claim 7 wherein the clips comprise:
a first portion integrally formed in the wall of the housing and a leg extending from the first portion, the leg spaced from the wall of the housing to define the opening between the leg and the wall of the housing.

13. The apparatus of claim 12 wherein at least the leg of each clip extends inward into the housing from a major plane of the rear wall.

14. A method for constructing an electrical power service apparatus comprising the steps of:
providing a housing having a wall;
providing a meter socket on a panel;
providing a plurality of clips integrally formed from the wall and defining an opening for downwardly slidably attaching the panel to the housing without tool operative fasteners; and
providing at least one of the clips positioned in the housing to engage a bottom edge of the panel.

15. The method of claim 14 wherein:
the step of providing a meter socket on a panel further includes the step of providing the meter socket and a bypass device on the panel.

16. The method of claim 15 further comprising the step of:
pre-mounting the meter socket and the bypass device on the panel.

17. The method of claim 15 further comprising the step of:
forming the panel as a first panel carrying the meter socket and a separate panel;
providing the bypass device on the separate panel; and
separately mounting the panel carrying the meter socket and the separate panel carrying the bypass device on the enclosure.

18. the method of claim 14 further comprising the steps of:
providing a plurality of apertures on the panel complimentary in position to the plurality of clips; and
urging the apertures in the panel over the clips until the panel substantially engages the housing and then sliding the panel in a downward direction to engage edges of the apertures with the clips to mount the panel in the housing.

19. An electrical power service apparatus comprising:
a housing having a wall;
a meter socket having contacts for electrical connection to blade terminals of a watthour meter;
a panel supporting the meter socket;
a mounting plate mounted to the wall of the housing;
clips and apertures carried on the mounting plate and the panel for releasably attaching the panel carrying the meter socket to the housing without tool operative fasteners; and a tool receiving aperture formed in the mounting plate and positioned along one edge of the panel adapted to receive a tool for disengaging the plate from the receiving means.

20. A method for constructing an electrical power service apparatus comprising the steps of:
providing a housing;
providing a meter socket on a panel;
fixing a mounting plate in the housing;
providing a plurality of clips integrally formed from the mounting plate, each clip defining an opening adjacent the mounting plate for downwardly slidably attaching the panel to the housing without tool operative fasteners; and
providing at least one of the clips positioned in the housing to engage a bottom edge of the panel.

21. An electrical power service apparatus comprising:
a housing having a wall;
a meter socket having contacts for electrical connection to blade terminals of a watthour meter;
a panel supporting the meter socket;
a plurality of clips in a preset arrangement carried in the housing, each clip having one portion spaced from the wall of the housing to define an opening for downwardly slidably receiving and supporting the panel in the housing without tool operative fasteners; and
an aperture formed in the wall of the housing and positioned along one edge of the panel, the aperture adapted for receiving a tool to disengage the panel from the clips.

22. An electrical power service apparatus including a panel carrying at least one of a meter socket having contacts for electrical connection to blade terminals of the watthour meter and a bypass switch for bypassing meter socket contacts, mounted on a panel, the apparatus comprising:
a housing having a wall; and
a plurality of clips integrally formed in a preset arrangement from the wall of the housing, each clip having one portion spaced from the wall of the housing to define an opening for downwardly slidably receiving and supporting the panel in the housing, at least one of the clips positioned in the housing to engage a bottom edge of the panel.

23. An electrical power service apparatus including a panel carrying at least one of a meter socket having contacts for electrical connection to blade terminals of the watthour meter and a bypass switch for bypassing meter socket contacts, mounted on a panel, the apparatus comprising:
a housing having a wall;
a mounting plate mounted to the wall of the housing; and
a plurality of clips integrally formed in a preset arrangement from the mounting plate, each clip having one portion spaced from the mounting plate to define an opening adapted for downwardly slidably receiving and supporting the panel in the housing, at least one of the clips positioned in the housing to engage a bottom edge of the panel.

* * * * *

UNITED STATES PATENT AND TRADEMARK OFFICE
CERTIFICATE OF CORRECTION

| | |
|---|---|
| PATENT NO. | : 7,479,029 B2 |
| APPLICATION NO. | : 10/831992 |
| DATED | : January 20, 2009 |
| INVENTOR(S) | : Cook et al. |

Page 1 of 1

It is certified that error appears in the above-identified patent and that said Letters Patent is hereby corrected as shown below:

Column 10, lines 25-27 "Claims 14-18" should be deleted

Signed and Sealed this

Thirty-first Day of March, 2009

JOHN DOLL
*Acting Director of the United States Patent and Trademark Office*